United States Patent [19]

Thillays

[11] Patent Number: 4,560,901
[45] Date of Patent: Dec. 24, 1985

[54] LIGHT-EMITTING DEVICE HAVING AT LEAST TWO SEMICONDUCTOR CRYSTALS

[75] Inventor: Jacques C. Thillays, Herouville St. Clair, France

[73] Assignee: U.S. Philips Corporation, New York, N.Y.

[21] Appl. No.: 453,377

[22] Filed: Dec. 27, 1982

[30] Foreign Application Priority Data

Jan. 29, 1982 [FR] France ................................ 82 01463

[51] Int. Cl.⁴ ..................... H05B 33/02; H01L 33/00
[52] U.S. Cl. ................................... 313/499; 313/501; 313/110; 357/17
[58] Field of Search ............... 313/499, 500, 501, 110; 357/17, 72, 45; 250/552, 553

[56] References Cited

U.S. PATENT DOCUMENTS

| | | | |
|---|---|---|---|
| 3,739,241 | 6/1973 | Thillays | 313/499 X |
| 3,875,456 | 4/1975 | Kano et al. | 313/501 |
| 3,875,473 | 4/1975 | Lebailly | 313/499 X |
| 4,011,575 | 3/1977 | Groves | 357/17 |
| 4,013,915 | 3/1977 | Dufft | 313/499 |
| 4,255,688 | 3/1981 | Nagasawa | 313/499 |
| 4,354,140 | 12/1982 | Nishizawa | 313/499 |

Primary Examiner—David K. Moore
Assistant Examiner—K. Wieder
Attorney, Agent, or Firm—Robert T. Mayer; Steven R. Biren

[57] ABSTRACT

An electroluminescent device is provided with two semiconductor crystals, in each of which an electroluminescent junction is formed, which junctions can alternately be energized from an external current source. One of the semiconductor crystals is of the p/n-type and the other semiconductor crystal is of the n/p-type, while both crystals are provided on the bottom of a reflecting cavity of a single metal support.

5 Claims, 1 Drawing Figure

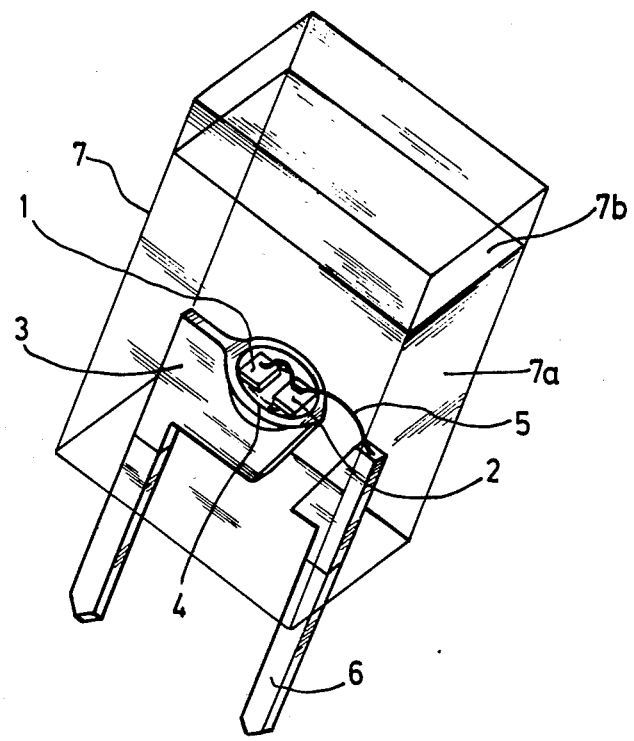

LIGHT-EMITTING DEVICE HAVING AT LEAST TWO SEMICONDUCTOR CRYSTALS

BACKGROUND OF THE INVENTION

The invention relates to a light transmitter comprising at least two semiconductor crystals, in each of which an electroluminescent junction is formed between two regions of opposite conductivity types, the said crystals being accommodated in a transparent protective envelope which has a surface from which the radiation emitted by the said junctions emanates. The junctions can be alternately energized from an external current source through two output electrodes which are passed through the said transparent envelope.

Electroluminescent diodes are frequently used for visual display, in particular in data processing technology. A logic state in binary form can be visualized by means of a diode which assumes two states: illuminated diode or, extinguished diode. However, in the case of a strong environmental illumination, the reflection effects on the optical properties of the said diodes may give rise to interpretation errors. For this reason, different logic states are preferably visualized by means of diodes which emit in different wave lengths, for example, in the red and in the green range.

Two-colored light elements are already known which consist of two semiconductor crystals, one of which emits in the red range at a given polarity, while the other at the opposite polarity emits in the green range, as shown in U.S. Pat. No. 3,873,979.

The crystals used are of the p/n type, i.e. crystals in which in a body of the n-conductivity type a doped zone of the p-conductivity type is present, the light emanating from the latter zone. However, use of these crystals in light transmitters leads to technological difficulties. For reasons of rationalization, it is to be preferred that such devices comprise only two electrodes. In order that the region of n-conductivity type of one of the crystals will be in electrical contact with the region of p-conductivity type of the other crystal, it is necessary that the n-type regions are insulated from each other, that is to say that their metal supports are also insulated from each other. This condition consequently leads to the use of two separate supports.

Such a construction is complicated and not very economical and yields a moderate result. The crystals are in fact necessarily arranged eccentrically with respect to the longitudinal axis of the light element and with the use of two separate supports it is difficult to keep this eccentricity low.

The said crystals are enveloped by a colorless resin, but in order to reduce the eccentricity effect of the crystals, this resin must contain a diffuse constituent which gives a less agreeable gray shade and which in the presence of a strong environmental illumination does not improve the contrast.

The electroluminescent diodes may also be used outside the visible spectrum for more specific applications, in particular in the field of the information transmission. In the case in which they are at least joined together pairwise in the same device, difficulties are met which are substantially similar to those mentioned above.

The known devices have other disadvantages due to the fact that they must comprise only two output electrodes, whereas originally each of the crystals also comprise two electrodes which are each connected to a semiconductor region. The first of the electrodes of each crystal consists of the metal support of the said crystal and the second electrode is a simple connection tongue. During construction of the device, the first electrode of one of the crystals must be electrically connected to the second electrode of the other crystal and conversely, the distance between the crystal supports and the crystals themselves should be kept constant.

The construction of such light transmitters consequently involves a number of difficulties, only a moderate product being obtained at a comparatively high cost, with and a mass production being difficult.

SUMMARY OF THE INVENTION

The present invention has for its object to mitigate these disadvantages. For this purpose, a light transmitter of the kind mentioned above is characterized in that the two crystals are secured on a single metal support on the bottom of a reflecting cavity, in that one of the crystals has a subjacent n-type region secured to the support and an upper p-type region from which the light emanates, and in that the other crystal has a subjacent p-type region secured to the support and an upper n-type region from which the light emanates, the support constituting a first common output electrode for the subjacent regions of the crystals which are secured thereto, while a second output electrode is connected to the upper regions of the two crystals.

The manufacture of such a device does not meet with any particular difficulties. This manufacture in fact requires only a single support, which simplifies the operations and renders it possible to reduce the number of wire connections between the two crystals. Furthermore, due to the presence of a reflecting cavity, the crystals can be automatically centered as close as possible to the optical longitudinal axis of the envelope. This reflecting cavity moreover provides the advantage that the emitted light is concentrated, which results in a higher efficiency.

Furthermore, when the two crystals operate in rapid alternation, the optical mixing effect due to prolonged light impressions on the human eye is intensified by the presence of the reflecting cavity, a mixed color being obtained which is composed of the colors originally supplied by the two semiconductor crystals.

When the crystals of the device operate in rapid alternation, it is also possible for the device to be connected to a photo-receiver, such as a photoresistor, in order to obtain a photo-coupling device without polarity which is sensitive to a considerable part of the light spectrum which is determined by the wave lengths of radiation emitted by the electroluminescent diodes.

Another advantage of the device according to the invention resides in the fact that the presence of the two crystals of alternately p/n and n/p-types (these are crystals in which in a body of the n-conductivity type and the p-conductivity type respectively, a doped zone of the p-conductivity type and the n-conductivity type, respectively, is formed) on the same support readily permits limiting the number of output electrodes to two without a large number of interconnections within the envelope.

The semiconductor crystals used are frequently obtained from III/V compounds; in the first preferred embodiment of the invention, the n/p-type crystal consists of GaAlAs and the p/n-type crystal consists of GaP. Thus, mistakes during the assembly of the device are avoided; further, the junctions formed emit rays of very different and hence strongly contrasting wave lengths, i.e. the first junction in the red range and the second junction in the green range.

Insofar as the brightness of the radiation emitted by one of the crystals greatly differs from that emitted by another crystal, the output should be harmonized. For this purpose, the transparent envelope consists, for example, of two optically different zones, one of which is especially capable of absorbing the radiation emitted by one of the said crystals.

When the envelope consisting of a suitable resin is provided, the two zones of the envelope can be shaded with colors which are related to the wavelength range in which the crystals emit. With the use of this solution, the device can also be identified immediately.

Preferably, a device constituted by a crystal of GaAlAs and a crystal of GaP is provided with an envelope consisting of a first filtering zone of green color, on which a second zone of red color is formed. The device thus exhibits a sufficient contrast effect in the case of a comparatively strong environmental illumination, which advantage is generally obtained only in monochromatic light elements.

In a second preferred embodiment of the invention, both crystals consist of GaAs and the electroluminescent junctions formed therein emit radiation of the same wave length, irrespective of the direction of the current supplied to the device. This embodiment is in particular intended for use of the light transmitter together with a photoreceiver for obtaining a photocoupling device without polarity.

The invention will now be described more fully with reference to the accompanying drawing.

BRIEF DESCRIPTION OF THE DRAWING

The sole FIGURE shows a device according to the invention. It should be noted that in the said FIGURE, the dimensions are considerably enlarged and are not proportional for the sake of clarity of the drawing.

DESCRIPTION OF THE PREFERRED EMBODIMENT

The FIGURE indicates that the device according to the invention is provided with two semiconductor crystals 1 and 2, in each of which an electroluminescent junction (not shown in the FIGURE) is formed. The crystal 1 consists, for example, of GaAlAs of the n/p-conductivity type. It has the shape of a square with sides of 0.3 mm and emits in the red range. The crystal 2, likewise in the shape of a square, is a block of GaP and is of the p/n-conductivity type. It has sides of 0.3 mm and emits in the green range.

According to the invention, the crystals 1 and 2 are supported by a single metal support 3 in which a reflecting cavity 4 is provided. The crystals are secured on the bottom of the cavity 4 by soldering or gluing by means of a conductive resin.

The support 3 constitutes a first common electrode for the p-type region of the crystal 1 and for the n-type region of the crystal 2. The upper regions of the crystals are connected through a wire 5 to a second electrode 6 which has the form of a tongue.

The crystals 1 and 2, like the electrodes 3 and 6, are surrounded by a transparent envelope 7 of epoxy resin. A first zone 7a of the envelope 7 is filled with a filtering substance of green color, while a second zone 7b (the surface zone) is filled with a substance of red color.

The manufacture of the device according to the invention is very simple. In fact, by a suitable choice of the shape and the dimensions of the reflecting cavity 4, the crystals 1 and 2 are automatically centered and the other operations are effected with the aid of known means and equipment. In general, the reflecting cavity 4 is substantially semispherical or elongate and the length of the diameter or of the major axis on the bottom of the cavity does not exceed 0.8 mm for crystals of 0.3 mm.

What is claimed is:

1. A light transmitter comprising at least two semiconductor crystals, in each of which an electroluminescent junction is formed between two regions of opposite conductivity types, said crystals being accommodated in a transparent protective envelope which has a surface from which the radiation emitted by said junction emanates, which junctions can be alternately energized from an external current source through only output electrodes which are passed through said transparent envelope, said two crystals being secured on a single metal support on the bottom of a reflecting cavity, one of the crystals having a subjacent n-type region secured to said support and an upper p-type region from which the light emanates, and the other crystal having a subjacent p-type region secured to said support and an upper n-type region from which the light emanates, said support comprising a portion of a first of said two electrodes with said subjacent regions of the crystals secured thereto, while a second of said two electrodes is connected to the upper regions of said two crystals, so that the two crystals are connected in parallel.

2. A device as claimed in claim 1, characterized in that the semiconductor crystals are obtained from III–V compounds.

3. A device as claimed in claim 2, characterized in that the crystal of the n/p-conductivity type comprises GaAlAs and in that the crystal of the p/n-conductivity type comprises GaP.

4. A device as claimed in claim 1, 2 or 3, wherein said two crystals comprise a crystal of GaAlAs and a crystal of GaP which are surrounded by an envelope comprising a first filtering zone of green color, on which a second zone of red color is formed.

5. A device as claimed in claim 2, characterized in that said two crystals are made of GaAs and in that the junctions formed therein emit radiations of the same wave-length, irrespective of the direction of the current supplied to the device.

* * * * *